(12) United States Patent
Chun et al.

(10) Patent No.: US 11,121,070 B2
(45) Date of Patent: Sep. 14, 2021

(54) INTEGRATED FAN-OUT PACKAGE

(71) Applicant: Taiwan Semiconductor Manufacturing Company, Ltd., Hsinchu (TW)

(72) Inventors: Shu-Rong Chun, Hsinchu (TW); Tin-Hao Kuo, Hsinchu (TW); Chi-Hui Lai, Taichung (TW); Kuo Lung Pan, Hsinchu (TW); Hao-Yi Tsai, Hsinchu (TW); Chung-Shi Liu, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 12 days.

(21) Appl. No.: 16/671,322

(22) Filed: Nov. 1, 2019

(65) Prior Publication Data

US 2020/0251407 A1 Aug. 6, 2020

Related U.S. Application Data

(60) Provisional application No. 62/799,129, filed on Jan. 31, 2019.

(51) Int. Cl.
| | |
|---|---|
| *H01L 23/495* | (2006.01) |
| *H01L 23/498* | (2006.01) |
| *H01L 25/065* | (2006.01) |
| *H01L 23/31* | (2006.01) |

(52) U.S. Cl.
CPC ...... *H01L 23/4985* (2013.01); *H01L 23/3114* (2013.01); *H01L 25/0655* (2013.01)

(58) Field of Classification Search
CPC ............. H01L 23/4985; H01L 23/3114; H01L 25/0655; H01L 25/0657
See application file for complete search history.

(56) References Cited

U.S. PATENT DOCUMENTS

| | | | | |
|---|---|---|---|---|
| 2004/0041271 A1* | 3/2004 | Storli | ...................... | H01L 24/94 257/759 |
| 2014/0034366 A1* | 2/2014 | Otsubo | ................ | H05K 3/4691 174/254 |
| 2015/0187710 A1* | 7/2015 | Scanlan | .................. | H01L 23/48 257/777 |
| 2016/0350572 A1* | 12/2016 | Kim, II | ............... | G06F 3/03547 |

* cited by examiner

*Primary Examiner* — Phuc T Dang
(74) *Attorney, Agent, or Firm* — Slater Matsil, LLP

(57) ABSTRACT

A device includes a package. The package includes a plurality of dies, an encapsulant encapsulating the plurality of dies, and a redistribution structure over the plurality of dies and the encapsulant. The device further includes first sockets bonded to a top surface of the redistribution structure and a rigid/flexible substrate bonded to the top surface of the redistribution structure. The rigid/flexible substrate includes a first rigid portion, a second rigid portion, and a flexible portion interposed between the first rigid portion and the second rigid portion. The device further includes second sockets bonded to the first rigid portion of the rigid/flexible substrate and connector modules bonded to the second rigid portion of the rigid/flexible substrate.

20 Claims, 13 Drawing Sheets

INTEGRATED FAN-OUT PACKAGE

PRIORITY CLAIM AND CROSS-REFERENCE

This application claims the benefit of U.S. Provisional Application No. 62/799,129, filed on Jan. 31, 2019, which application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DICs where dies are packaged and are then packaged together with another packaged die or dies. Chip-on-package (COP) devices are another type of 3DICs where dies are packaged and are then packaged together with another die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
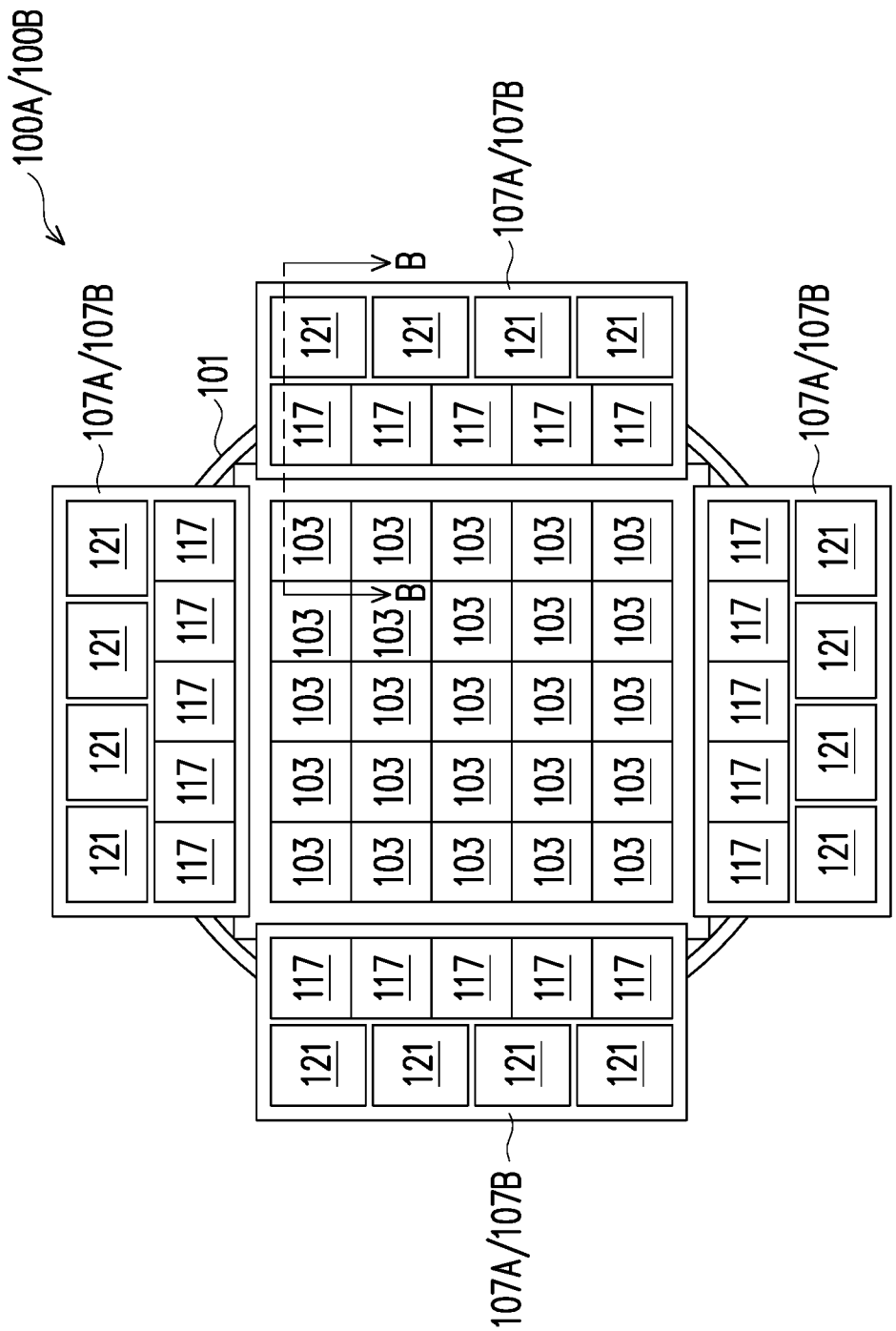
FIGS. 1A, 1B and 1C illustrate top and cross-sectional views of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a package device comprising integrated circuit packages, such as integrated fan-out (InFO) packages. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, or the like, or mounting input components, boards, dies or other components, or for connection packaging or mounting combinations of any type of integrated circuits or electrical components.

Various embodiments described herein use a rigid/flexible substrate to provide high-bandwidth interconnections between adjacent InFO packages through high-speed connectors attached to the rigid/flexible substrate. In some embodiments, the rigid/flexible substrate further provides interconnections between an InFO package and external systems using sockets attached to the rigid/flexible substrate. In some embodiments, the rigid/flexible substrate eliminates an area constraint for the high-pin-density connectors. In some embodiments, the rigid/flexible substrate allows for attaching high-pin-density connectors for high-bandwidth applications, such as a data center, a server, a high power computing (HPC) application, an accelerator of an artificial intelligence (AI) server, cloud computing or edge computing applications, network applications, or the like. In some embodiments, the use of the rigid/flexible substrate allows for increased flexibility of the interconnections to bend according to the wafer warpage and allows for overcoming issues with uneven heights between adjacent InFO packages.

Figure 1B:
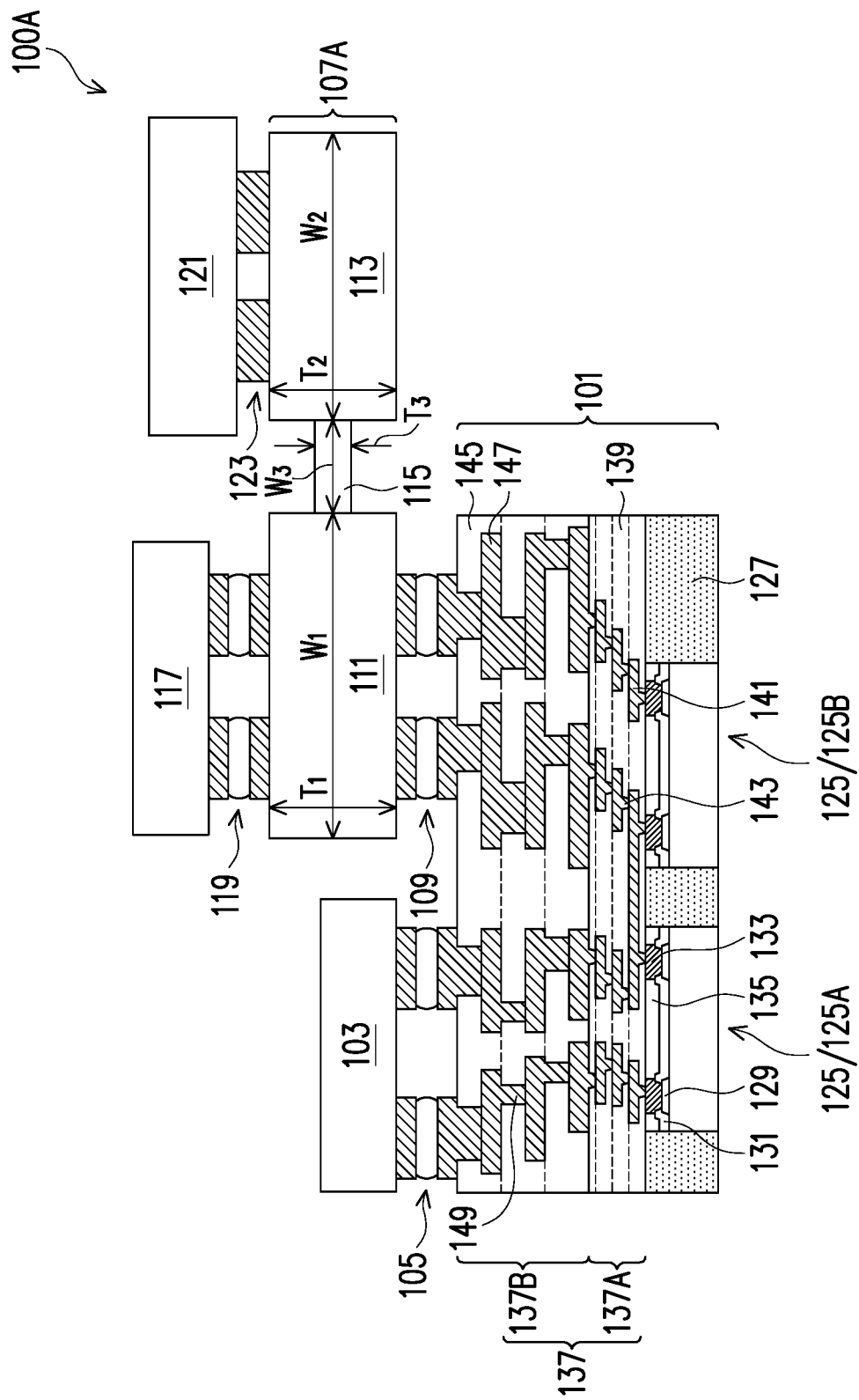
Figure 1C:
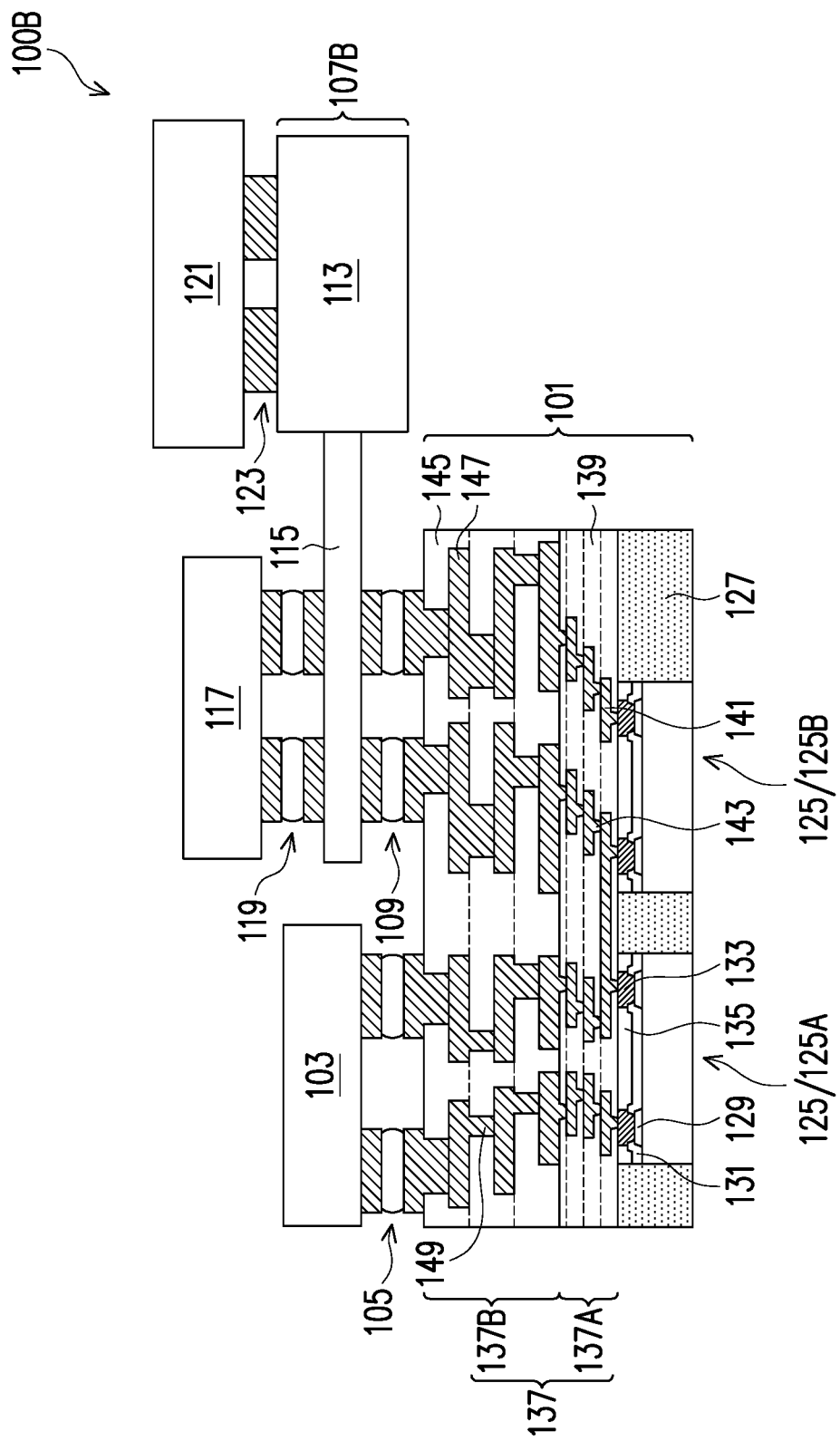

FIGS. 1A, 1B and 1C illustrate top and cross-sectional views of a package 100A/100B in accordance with some embodiments. FIG. 1A illustrates a top view of the package 100A/100B, while FIG. 1B illustrates a cross-sectional view of the package 100A along a line BB illustrated in FIG. 1A and FIG. 1C illustrates a cross-sectional view of the package 100B along the line BB illustrated in FIG. 1A. In some embodiments, the package 100A/100B comprises a package component 101. In some embodiments, the package component 101 is an integrated fan-out (InFO) package, such as a fan-out wafer level package (FOWLP). Referring to FIG. 1B, the package component 101 comprises a plurality of integrated circuit (IC) dies (or chips) 125 encapsulated in an encapsulant 127.

Each of the IC dies 125 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an application-specific die (e.g., an application-specific integrated circuit (ASIC), a field-programmable gate array (FPGA), etc.), a combinations thereof, or the like.

The IC dies 125 may be formed in a wafer, which may include different device regions that are singulated in subsequent steps to form the IC dies 125. The IC dies 125 may be processed according to applicable manufacturing processes to form integrated circuits. In some embodiments, each of the IC dies 125 comprises a substrate (not individually shown), one or more active and/or passive devices (not individually shown) on the substrate, and an interconnect structure (not individually shown) over the one or more active and/or passive devices and the substrate. In some embodiments, the substrate may be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

The substrate has an active surface (e.g., the surface facing upwards in FIG. 1B), sometimes called a front side, and an inactive surface (e.g., the surface facing downwards in FIG. 1B), sometimes called a back side. The one or more active and/or passive devices may be formed at the front surface of the substrate. In some embodiments, the one or more active and/or passive devices may include devices, such as transistors, capacitors, resistors, diodes, photo-diodes, fuses, or the like. In some embodiments, the one or more active and/or passive devices may be formed over the substrate using suitable formation methods.

In some embodiments, the interconnect structure may comprise a plurality of dielectric layers (such an inter-layer dielectric (ILD)/inter-metal dielectric layers (IMDs)) and interconnects (such as conductive lines and vias) within the dielectric layers. The dielectric layers may be formed, for example, of a low-K dielectric material, such as phosphosilicate glass (PSG), borophosphosilicate glass (BPSG), FSG, SiOxCy, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), a combination thereof, or the like. In some embodiments, interconnects may be formed in the dielectric layers using, for example, a damascene process, a dual damascene process, a combination thereof, or the like. In some embodiments, interconnects may comprise copper, a copper alloy, silver, gold, tungsten, tantalum, aluminum, a combination thereof, or the like. In some embodiments, the interconnects provide electrical connections between the one or more active and/or passive devices formed on the substrate to form desired integrated circuits.

In some embodiments, each of the IC dies 125 further includes a plurality of contact pads 129 over the interconnect structure. The contact pads 129 may be electrically coupled to the one or more active and/or passive devices through the interconnect structure. In some embodiments, the contact pads 129 may comprise a conductive material such as aluminum, copper, tungsten, silver, gold, a combination thereof, or the like. In some embodiments, a conductive material may be formed over the interconnect structure using, for example, physical vapor deposition (PVD), atomic layer deposition (ALD), electro-chemical plating, electroless plating, a combination thereof, or the like. Subsequently, the conductive material is patterned to form the contact pads 129. In some embodiments, the conductive material may be patterned using suitable photolithography and etching techniques. Generally, photolithography techniques involve depositing a photoresist material (not shown), which is subsequently irradiated (exposed) and developed to remove a portion of the photoresist material. The remaining photoresist material protects the underlying material, such as the conductive material of the contact pads 129 from subsequent processing steps, such as etching. A suitable etching process, such as a reactive ion etch (RIE) or other dry etch, an isotropic or anisotropic wet etch, or any other suitable etch or patterning process may be applied to the conductive material to remove exposed portions of the conductive material and form the contact pads 129. Subsequently, the photoresist material may be removed using, for example, an ashing process followed by a wet clean process.

In some embodiments, a passivation layer 131 is formed over the interconnect structure and the contact pads 129. In some embodiments, the passivation layer 131 may comprise one or more layers of non-photo-patternable insulating materials, such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In some embodiments, the passivation layer 131 may be patterned to expose the contact pads 129. The passivation layer 131 may be patterned using suitable photolithography and etching methods.

In some embodiments, die connectors 133, such as conductive pillars (for example, formed of a metal such as copper), extend through the openings in the passivation layer 131 and are physically and electrically coupled to respective ones of the contact pads 129. The die connectors 133 may be formed by, for example, plating, or the like. The die connectors 133 electrically couple the respective integrated circuits of the IC die 125. Optionally, solder regions (e.g., solder balls or solder bumps) may be disposed on the die connectors 133. The solder regions may be used to perform chip probe (CP) testing on the IC die 125. The CP testing may be performed on the IC die 125 to ascertain whether the IC die 125 is a known good die (KGD). Thus, only IC dies 125, which are KGDs, undergo subsequent processing and are packaged, and dies, which fail the CP testing, are not packaged. After testing, the solder regions may be removed in subsequent processing steps.

In some embodiments, a protection/buffer layer 135 may (or may not) be formed on the active side of the IC die 125, such as on the passivation layer 131 and the die connectors 133. The protection/buffer layer 135 laterally encapsulates the die connectors 133, and the protection/buffer layer 135 is laterally coterminous with the IC die 125. Initially, the protection/buffer layer 135 may bury the die connectors 133, such that the topmost surface of the protection/buffer layer 135 is above the topmost surfaces of the die connectors 133. In some embodiments where solder regions are disposed on the die connectors 133, the protection/buffer layer 135 may also bury the solder regions. Alternatively, the solder regions may be removed prior to forming the protection/buffer layer 135.

The protection/buffer layer 135 may be formed of photo-patternable insulating materials, such as polybenzoxazole (PBO), polyimide (PI), benzocyclobutene (BCB), a combination thereof, or the like, and may be formed using a spin-on coating process, a lamination process, a combination thereof, or the like. In some embodiments, the die connectors 133 are exposed through the protection/buffer layer 135 during formation of the IC die 125. In some embodiments, the die connectors 133 remain buried and are exposed during a subsequent process for packaging the IC die 125. Exposing the die connectors 133 may remove any solder regions that may be present on the die connectors 133.

In some embodiments, the IC die 125 is a stacked device that includes multiple substrates. For example, the IC die 125 may be a memory device, such as a hybrid memory cube (HMC) device, a high bandwidth memory (HBM) device, or the like that includes multiple memory dies. In such embodiments, the IC die 125 includes multiple substrates interconnected by through-substrate vias (TSVs). Each of the substrates may (or may not) have an interconnect structure.

In some embodiments, the IC dies 125 are encapsulated in the encapsulant 127. In some embodiments, the IC dies 125 are attached to a carrier substrate (not shown) and the encapsulant 127 is formed over the carrier substrate, and over and surrounding the IC dies 125. A planarization process is then performed on the encapsulant 127 to expose the die connectors 133 of the IC dies 125. Topmost surfaces of the encapsulant 127, the die connectors 133, and the protection/buffer layers 135 are coplanar after the planarization process. The planarization process may be, for example, a chemical-mechanical polish (CMP). In some embodiments, the encapsulant 127 may comprise a molding compound such as an epoxy, a resin, a moldable polymer, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the IC dies 125.

In some embodiments, the package component 101 further includes a redistribution structure 137 formed over the IC dies 125 and the encapsulant 127. The redistribution structure 137 comprises a fine-featured portion 137A and a coarse-featured portion 137B over the fine-featured portion 137A. The redistribution structure 137 includes metallization patterns and insulating layers. The metallization patterns may also be referred to as redistribution layers or redistribution lines. The redistribution structure 137 is shown as an example having six layers of metallization patterns. More or fewer insulating layers and metallization patterns may be formed in the redistribution structure 137. The fine-featured portion 137A and the coarse-featured portion 137B of the redistribution structure 137 include metallization patterns and insulating layers of differing sizes.

In some embodiments, the fine-featured portion 137A of the redistribution structure 137 comprises a plurality of insulating layers 139 (indicated by dashed lines) and redistribution layers (comprising conductive lines 141 and conductive vias 143) within plurality of insulating layers 139. In some embodiments, the plurality of insulating layers 139 may comprise non-photo-patternable insulating materials, such as silicon nitride, silicon oxide, PSG, BSG, BPSG, a combination thereof, or the like, and may be formed using CVD, PVD, ALD, a spin-on coating process, a combination thereof, or the like. In some embodiments, the conductive lines 141 and conductive vias 143 may be formed in the insulating layers 139 using, for example, a damascene process, a dual damascene process, a combination thereof, or the like. In some embodiments, the conductive lines 141 and conductive vias 143 may comprise copper, a copper alloy, silver, gold, tungsten, tantalum, aluminum, a combination thereof, or the like.

In some embodiments, the coarse-featured portion 137B of the redistribution structure 137 comprises a plurality of insulating layers 145 (indicated by dashed lines) and redistribution layers (comprising conductive lines 147 and conductive vias 149) within plurality of insulating layers 145. In some embodiments, the plurality of insulating layers 145 may comprise the photo-patternable insulating materials, such as PBO, PI, BCB, a combination thereof, or the like, and may be formed using a spin-on coating process, or the like. In some embodiments, the conductive lines 147 and conductive vias 149 may comprise copper, a copper alloy, silver, gold, tungsten, tantalum, aluminum, a combination thereof, or the like. In some embodiments, process steps for forming a redistribution layer includes patterning a respective one of the insulating layers 145 to form openings therein using suitable photolithography methods. A seed layer (not shown) is then deposited over the respective one of the insulating layers 145 and in the openings. The seed layer may comprise one or more layers of copper, titanium, nickel, gold, manganese, a combination thereof, or the like, and may be formed by ALD, PVD, sputtering, a combination thereof, or the like. Subsequently, a patterned mask (not shown) having openings therein is deposited over the seed layer to define the desired pattern for the redistribution layer. A conductive material is then formed in the openings of the patterned mask and on the exposed portions of the seed layer by an electro-chemical plating process, an electroless plating process, ALD, PVD, sputtering, a combination thereof, or the like. Subsequently, the patterned mask is removed and portions of the seed layer exposed after removing the patterned mask are also removed. In some embodiments, the patterned mask comprising a photoresist material may be removed using, for example, an ashing process followed by a wet clean process. The exposed portions of the seed layer may be removed using, for example, a suitable etching process. The process steps for forming the redistribution layer is repeated for each of the insulating layers 145 until the desired number of redistribution layers is formed in the coarse-featured portion 137B of the redistribution structure 137.

In some embodiments, dimensions (such as lengths, widths, heights and thicknesses) of the conductive lines 147 and the conductive vias 149 of the coarse-featured portion 137B of the redistribution structure 137 are greater than dimensions of the conductive lines 141 and the conductive vias 143 of the fine-featured portion 137A of the redistribution structure 137. In such embodiments, thicknesses of the insulating layers 145 are greater than thicknesses of the insulating layers 139.

Referring further to FIGS. 1A, 1B and 1C, a plurality of sockets 103 are bonded to the redistribution structure 137 using connector joints 105. In some embodiments, the sockets 103 are electrically coupled to the IC dies 125 through the redistribution structure 137. In some embodiments, the each of the sockets 103 is disposed above a respective IC die 125. Accordingly, the package 100A/100B comprises an IC die 125 below each of the sockets 103. The sockets 103 may include different components, such as a chassis and contact pins, which may comprise different materials. The sockets 103 are electrical and physical interfaces for modules (discussed further below) that may be installed subsequent to manufacture of the package 100A/100B. For example, a user of the package 100A/100B may install modules in the sockets 103 to form a completed functional system. The type of modules selected for installation depends on the type of desired functional system. Examples of modules that may be installed in the sockets 103 include memory modules, voltage regulator modules, power supply modules, integrated passive device (IPD) modules, and the like. The sockets 103 may also be referred to as computing sockets. Accordingly, the IC dies 125A disposed directly below the sockets 103 may also be referred to computing IC dies.

In some embodiments, the connector joints 105 may comprise solder balls, controlled collapse chip connection (C4) bumps, ball grid array (BGA) balls, micro bumps, conductive pillars, electroless nickel-electroless palladium-immersion gold technique (ENEPIG) formed bumps, or the like. In some embodiments where the connector joints 105 comprise solder materials, a reflow process may be performed in order to shape the solder material into the desired bump shapes. In some embodiments where the connector joints 105 comprise conductive pillars, the connector joints 105 may further comprise cap layers that may be formed on the top of the conductive pillars. In some embodiments, the cap layers may comprise a solder, nickel, tin, tin-lead, gold, silver, palladium, indium, nickel-palladium-gold, nickel-gold, the like, a combination thereof, or the like, and may be formed using an electro-chemical plating process, an electroless plating process, a combination thereof, or the like.

Referring to FIGS. 1A and 1B, a plurality of rigid/flexible substrates 107A are bonded to the redistribution structure 137 using connector joints 109. In some embodiments, the rigid/flexible substrates 107A are electrically coupled to the IC dies 125 through the redistribution structure 137. In some embodiments, the connector joints 109 may be formed using similar materials and methods as the connector joints 105 and the description is not repeated herein. In some embodiments, each of the rigid/flexible substrates 107A comprises a first rigid portion 111, a second rigid portion 113 and a flexible portion 115 interposed between and connecting the first rigid portion 111 to the second rigid portion 113. In some embodiments, the flexible portion 115 is configured to bend and allow for an axis of the first rigid portion 111 to form a non-zero angle with an axis of the second rigid portion 113. In some embodiments, the rigid/flexible substrates 107A further comprise conductive features, such as conductive traces, which provide electrical connection between the package component 101 and electrical components bonded to the rigid/flexible substrates 107A. In some embodiments, the first rigid portions 111 of the rigid/flexible substrates 107A are attached to the redistribution structure 137 using the connector joints 109 such that the second rigid portions 113 of the rigid/flexible substrates 107A and at least portions of the flexible portions 115 of the rigid/flexible substrates 107A extend beyond an edge of the redistribution structure 137 (coinciding with an edge of the package component 101).

In some embodiments, the first rigid portion 111 of the rigid/flexible substrate 107A has a width $W_1$ between about 5 mm and about 50 mm. In some embodiments, the second rigid portion 113 of the rigid/flexible substrate 107A has a width $W_2$ between about 5 mm and about 50 mm. In some embodiments, the flexible portion 115 of the rigid/flexible substrate 107A has a width $W_3$ between about 1 mm and about 50 mm. In some embodiments, a ratio of $W_1/W_3$ is between about 0.1 and about 50. In some embodiments, a ratio of $W_2/W_3$ is between about 0.1 and about 50. In some embodiments, the first rigid portion 111 of the rigid/flexible substrate 107A has a thickness $T_1$ between about 1 mm and about 8 mm. In some embodiments, the second rigid portion 113 of the rigid/flexible substrate 107A has a thickness $T_2$ between about 1 mm and about 8 mm. In some embodiments, the flexible portion 115 of the rigid/flexible substrate 107A has a thickness $T_3$ between about 0.3 mm and about 2 mm. In some embodiments, a ratio of $T_1/T_3$ is between about 0.5 and about 27. In some embodiments, a ratio of $T_2/T_3$ is between about 0.5 and about 27.

In some embodiments, a plurality of sockets 117 are attached to an upper surface of the first rigid portion 111 of each of the rigid/flexible substrates 107A using connector joints 119. In some embodiments, the connector joints 119 may be formed using similar materials and methods as the connector joints 105 and the description is not repeated herein. The sockets 117 may be similar to the sockets 103 and the description is not repeated herein. In some embodiments, the sockets 117 provide input/output (I/O) interfaces for the package 100A. Accordingly, the sockets 117 may be also referred to as I/O sockets. In some embodiments, the each of the sockets 117 is disposed directly above a respective IC die 125. Accordingly, the package 100A comprises an IC die 125 directly below each of the sockets 117. Accordingly, the IC dies 125B disposed directly below the sockets 117 may also be referred to I/O interface IC dies.

In some embodiments, a plurality of connector modules 121 are bonded to an upper surface of the second rigid portion 113 of each of the rigid/flexible substrates 107A using connector joints 123. In some embodiments, the connector modules 121 may be high-pin-density connectors, or the like. The connector modules 121 are electrical and physical interfaces for the package 100A to external systems. In some embodiments when the package 100A is installed as part of a larger external system, such as a data center, the connector modules 121 may be used to couple the package 100A to the external system. In other embodiments, a plurality of packages (such as the package 100A) is coupled to one another using the connector modules 121 to form a larger system.

The sockets 103 and 117, the rigid/flexible substrates 107A, and connector modules 121 may be attached to the redistribution structure 137 in a variety of layouts. In some embodiments, the sockets 103 are disposed in the interior region of the redistribution structure 137 (coinciding with the interior region of the package component 101) as illustrated in FIGS. 1A and 1B. In some embodiments, the sockets 117 are disposed in the peripheral region of the redistribution structure 137 (coinciding with the peripheral region of the package component 101) as illustrated in FIGS. 1A and 1B. In some embodiments, the rigid/flexible substrates 107A are disposed in the peripheral region of the redistribution structure 137 (coinciding with the peripheral region of the package component 101) as illustrated in FIGS. 1A and 1B. In some embodiments, the connector modules 121 are disposed beyond the edge of the redistribution structure 137 (coinciding with the edge of the package component 101) as illustrated in FIGS. 1A and 1B. As illustrated in FIG. 1A, the package component 101 has a circular plan-view shape. In other embodiments, the package component 101 may have a shape of an ellipse, a rectangle, a square, a polygon, or the like in the plan view.

Referring to FIGS. 1A and 1C, in some embodiments, the rigid portion 111 may be omitted and each of the rigid/flexible substrates 107B may comprise the second rigid portion 113 attached to the flexible portion 115. In such embodiments, the flexible portions 115 of the rigid/flexible substrates 107B are attached to the redistribution structure 137 using the connector joints 109. Furthermore, the plurality of sockets 117 are attached to an upper surface of the flexible portions 115 of each of the rigid/flexible substrates 107B using connector joints 119.

Figure 2:
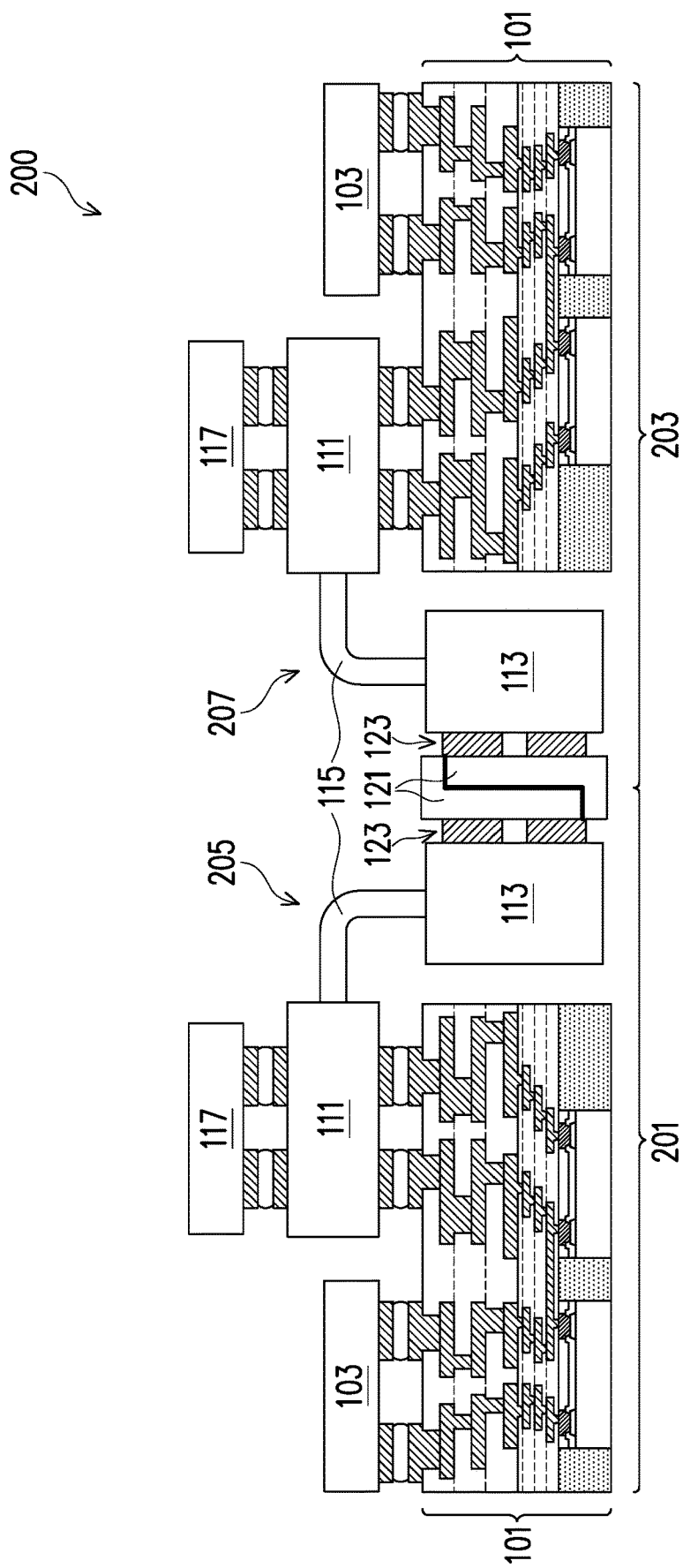
FIG. 2 illustrates a cross-sectional view of a package device in accordance with some embodiments.

FIG. 2 illustrates a cross-sectional view of a package device 200 in accordance with some embodiments. In some embodiments, the package device 200 comprises a plurality of packages coupled to one another using respective connector modules. FIG. 2 illustrates two adjacent packages 201 and 203 of the package device 200. In some embodiments, the packages 201 and 203 are similar to the package 100A described above with reference to FIGS. 1A and 1B, with like features being labeled by like numerical references, and the description of like features is not repeated herein. In some embodiments, each of the rigid/flexible substrates 205 and 207 may be implemented using the rigid/flexible substrate 107A illustrated in FIGS. 1A and 1B. In some embodiments, a flexible portion 115 of a rigid/flexible substrate 205 of the package 201 and a flexible portion 115 of a rigid/flexible substrate 207 of the package 203 are bent downward, such that a connector module 121 of the package 201 is attached to a connector module 121 of the package 203 and provides electrical connection between the package 201 and the package 203. In some embodiments, the connector module 121 of the package 201 and the connector module 121 of the package 203 are interposed between a sidewall of a package component 101 of the package 201 and a sidewall of a package component 101 of the package 203. In alternative embodiments, the packages 201 and 203 may similar to the package 100B described above with reference to FIGS. 1A and 1C. In such embodiments, each of the rigid/flexible substrates 205 and 207 may be implemented using the rigid/flexible substrate 107B illustrated in FIGS. 1A and 1C. In some embodiments, the plurality of the packages may be connected to one another in a similar manner as the packages 201 and 203 to form a device to be used in high-bandwidth applications, such as a data center, a server, a high power computing (HPC) application, an accelerator of an artificial intelligence (AI) server, cloud computing or edge computing applications, network applications, or the like.

Referring further to FIGS. 1A, 1B, 1C and 2, in some embodiments, by using the rigid/flexible substrates 107A, 107B, 205, and 207 the connector modules 121 are not disposed within a perimeter or an edge of the redistribution structure 137. Accordingly, more area of the redistribution structure 137 is available for the sockets 103 to be bonded to the redistribution structure 137. Furthermore, by using the rigid/flexible substrates 107A, 107B, 205, and 207, issues related to uneven heights between adjacent packages (caused by wafer warpage) may be overcome. The rigid/flexible substrates 107A, 107B, 205, and 207 may bend to accommodate uneven heights between adjacent packages (such as, for example, the packages 201 and 203 of the package device 200).

Figure 3:
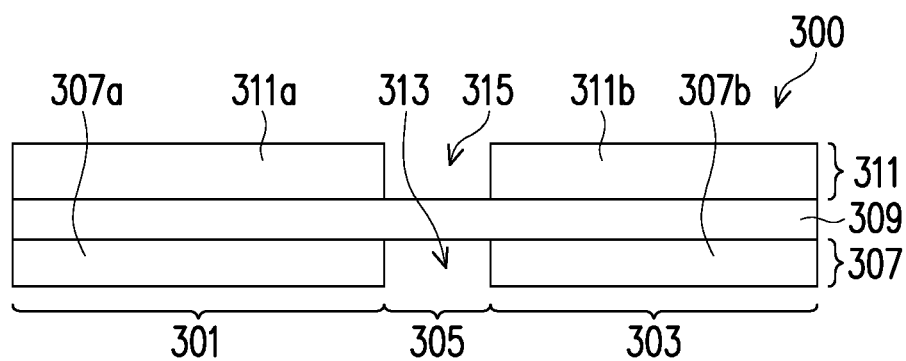
FIGS. 3-7 illustrate cross-sectional views of rigid/flexible substrates in accordance with some embodiments.

FIG. 3 illustrates a cross-sectional view of a rigid/flexible substrate 300 in accordance with some embodiments. In some embodiments, the rigid/flexible substrate 300 comprises a first rigid portion 301, a second rigid portion 303 and a flexible portion 305 interposed between and connecting the first rigid portion 301 to the second rigid portion 303. In some embodiments, the rigid/flexible substrate 300 comprises a printed circuit board (PCB). In some embodiments, the rigid/flexible substrate 300 comprises a first rigid layer 307, a second rigid layer 311, and a flexible layer 309 interposed between the first rigid layer 307 and the second rigid layer 311. In some embodiments, the first rigid layer 307 and the second rigid layer 311 may comprise a rigid material, such as bismaleimide triazine (BT) resin, FR4 (a composite material composed of woven fiberglass cloth with an epoxy resin binder that is flame resistant), a combination thereof, or the like. In some embodiments, the flexible layer 309 comprises a flexible material, such as a polymer material, for example. The polymer material may include polyimide, fluoropolymer/polyimide composite film, pyralux copper kapton laminate, a combination thereof, or the like. In some embodiments, the first rigid layer 307 has a thickness between about 1 mm and about 5 mm. In some embodiments, the second rigid layer 311 has a thickness between about 1 mm and about 5 mm. In some embodiments, the flexible layer 309 has a thickness between about 0.3 mm and about 2 mm.

In some embodiments, the first rigid layer 307 is patterned to form an opening 313 therein. The opening 313 exposes a portion of the flexible layer 309. The patterning process may comprise suitable photolithography and etching methods. In some embodiments, the opening 313 cuts the first rigid layer 307 into two disconnected portions 307a and 307b. In some embodiments, the second rigid layer 311 is patterned to form an opening 315 therein. The opening 315 exposes a portion of the flexible layer 309. The patterning process may comprise suitable photolithography and etching methods. In some embodiments, the opening 315 cuts the second rigid layer 311 into two disconnected portions 311a and 311b. In some embodiments, the openings 313 and 315 expose the same portion of the flexible layer 309, which forms the flexible portion 305 of the rigid/flexible substrate 300.

Referring further to FIG. 3, the first rigid portion 301 comprises a first disconnected portion 307a of the first rigid layer 307, a first disconnected portion 311a of the second rigid layer 311, and a portion of the flexible layer 309 interposed between the first disconnected portion 307a of the first rigid layer 307 and the first disconnected portion 311a of the second rigid layer 311. The second rigid portion 303 comprises a second disconnected portion 307b of the first rigid layer 307, a second disconnected portion 311b of the second rigid layer 311, and a portion of the flexible layer 309 interposed between the second disconnected portion 307b of the first rigid layer 307 and the second disconnected portion 311b of the second rigid layer 311. In some embodiments, the first rigid portion 301, the second rigid portion 303 and the flexible portion 305 of the rigid/flexible substrate 300 comprises conductive features, such conductive traces (not shown), that provide electrical connection to electrical components attached to the rigid/flexible substrate 300. In some embodiments, the rigid/flexible substrates 107A, 205 and 207 (see FIGS. 1A, 1B and 2) may be implemented by the rigid/flexible substrate 300. In some embodiments, the rigid/flexible substrates 107B (see FIGS. 1A and 1C) may be implemented by the rigid/flexible substrate 300 after removing the portions 307a and 311a.

Figure 4:
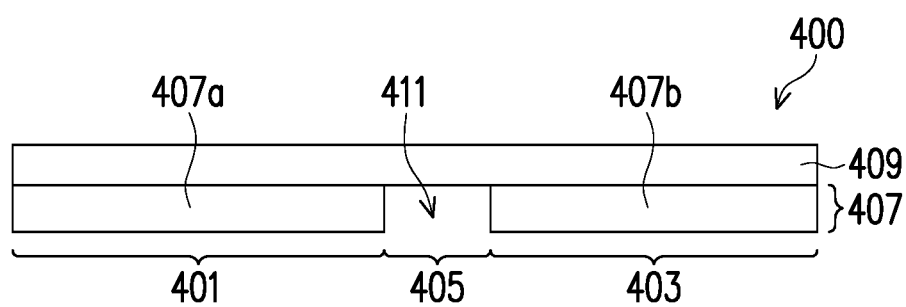

FIG. 4 illustrates a cross-sectional view of a rigid/flexible substrate 400 in accordance with some embodiments. In some embodiments, the rigid/flexible substrate 400 comprises a first rigid portion 401, a second rigid portion 403 and a flexible portion 405 interposed between and connecting the first rigid portion 401 to the second rigid portion 403. In some embodiments, the rigid/flexible substrate 400 comprises a printed circuit board (PCB). In some embodiments, the rigid/flexible substrate 400 comprises a rigid layer 407 and a flexible layer 409 over the rigid layer 407. In some embodiments, the rigid layer 407 may be formed using similar materials and methods as the rigid layer 307 described above with reference to FIG. 3 and the description is not repeated herein. In some embodiments, the flexible layer 409 may be formed using similar materials and methods as the flexible layer 309 described above with reference to FIG. 3 and the description is not repeated herein.

In some embodiments, the rigid layer 407 is patterned to form an opening 411 therein. The opening 411 exposes a portion of a lower surface of the flexible layer 409. The patterning process may comprise suitable photolithography and etching methods. In some embodiments, the opening 411 cuts the rigid layer 407 into two disconnected portions 407a and 407b. The portion of the flexible layer 409 exposed by the opening 411 forms the flexible portion 405 of the rigid/flexible substrate 400. The first rigid portion 401 comprises a first disconnected portion 407a of the rigid layer 407 and a portion of the flexible layer 409 disposed directly over the first disconnected portion 407a of the rigid layer 407. The second rigid portion 403 comprises a second disconnected portion 407b of the rigid layer 407 and a portion of the flexible layer 409 disposed directly over the second disconnected portion 407b of the rigid layer 407. In some embodiments, the rigid/flexible substrates 107A, 205 and 207 (see FIGS. 1A, 1B and 2) may be implemented by the rigid/flexible substrate 400. In some embodiments, the rigid/flexible substrates 107B (see FIGS. 1A and 1C) may be implemented by the rigid/flexible substrate 400 after removing the portion 407a.

Figure 5:
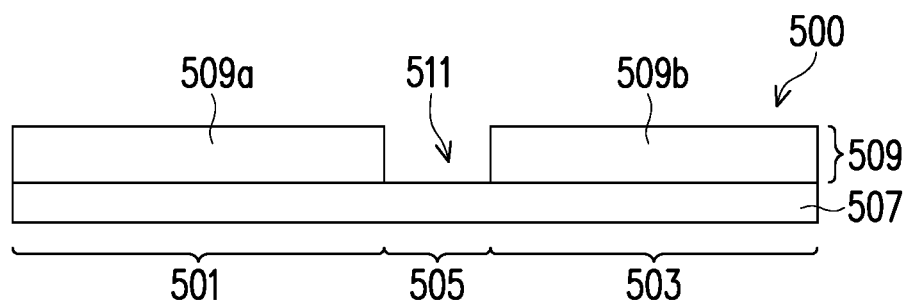

FIG. 5 illustrates a cross-sectional view of a rigid/flexible substrate 500 in accordance with some embodiments. In some embodiments, the rigid/flexible substrate 500 comprises a first rigid portion 501, a second rigid portion 503 and a flexible portion 505 interposed between and connecting the first rigid portion 501 to the second rigid portion 503. In some embodiments, the rigid/flexible substrate 500 comprises a printed circuit board (PCB). In some embodiments, the rigid/flexible substrate 500 comprises a flexible layer 507 and a rigid layer 509 over the flexible layer 507. In some embodiments, the rigid layer 509 may be formed using similar materials and methods as the rigid layer 311 described above with reference to FIG. 3 and the description is not repeated herein. In some embodiments, the flexible layer 507 may be formed using similar materials and methods as the flexible layer 309 described above with reference to FIG. 3 and the description is not repeated herein.

In some embodiments, the rigid layer 509 is patterned to form an opening 511 therein. The opening 511 exposes a portion of an upper surface of the flexible layer 507. The patterning process may comprise suitable photolithography and etching methods. In some embodiments, the opening 511 cuts the rigid layer 509 into two disconnected portions 509a and 509b. The portion of the flexible layer 507 exposed by the opening 511 forms the flexible portion 505 of the rigid/flexible substrate 500. The first rigid portion 501 comprises a first disconnected portion 509a of the rigid layer 509 and a portion of the flexible layer 507 disposed directly below the first disconnected portion 509a of the rigid layer 509. The second rigid portion 503 comprises a second disconnected portion 509b of the rigid layer 509 and a portion of the flexible layer 507 disposed directly below the second disconnected portion 509b of the rigid layer 509. In some embodiments, the rigid/flexible substrates 107A, 205 and 207 (see FIGS. 1A, 1B and 2) may be implemented by the rigid/flexible substrate 500. In some embodiments, the rigid/flexible substrates 107B (see FIGS. 1A and 1C) may be implemented by the rigid/flexible substrate 500 after removing the portion 509a.

Figure 6:
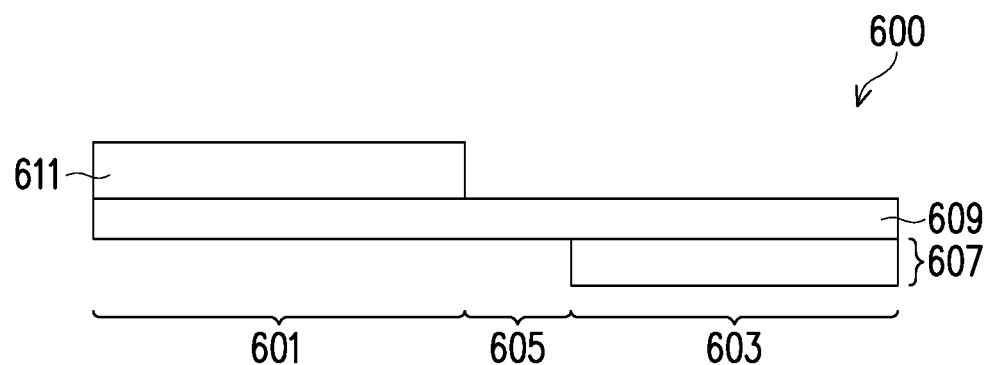

FIG. 6 illustrates a cross-sectional view of a rigid/flexible substrate 600 in accordance with some embodiments. In some embodiments, the rigid/flexible substrate 600 comprises a first rigid portion 601, a second rigid portion 603 and a flexible portion 605 interposed between and connecting the first rigid portion 601 to the second rigid portion 603. In some embodiments, the rigid/flexible substrate 600 comprises a printed circuit board (PCB). In some embodiments, the rigid/flexible substrate 600 comprises a first rigid layer 607, a second rigid layer 611, and a flexible layer 609 interposed between the first rigid layer 607 and the second rigid layer 611. In some embodiments, the first rigid layer 607 may be formed using similar materials and methods as the first rigid layer 307 described above with reference to FIG. 3 and the description is not repeated herein. In some embodiments, the second rigid layer 611 may be formed using similar materials and methods as the second rigid layer 311 described above with reference to FIG. 3 and the description is not repeated herein. In some embodiments, the flexible layer 609 may be formed using similar materials and methods as the flexible layer 309 described above with reference to FIG. 3 and the description is not repeated herein.

The first rigid layer 607 is patterned to expose a portion of a lower surface of the flexible layer 609 and the second rigid layer 611 is patterned to expose a portion of an upper surface of the flexible layer 609. The patterning process may comprise suitable photolithography and etching methods. The first rigid portion 601 comprises a remaining portion of the second rigid layer 611 and a portion of the flexible layer 609 disposed directly below the remaining portion of the second rigid layer 611. The second rigid portion 603 comprises a remaining portion of the first rigid layer 607 and a portion of the flexible layer 609 disposed directly over the remaining portion of the first rigid layer 607. A portion of the flexible layer 609 interposed between the first rigid portion 601 and the second rigid portion 603 forms a flexible portion 605 of the rigid/flexible substrate 600. In some embodiments, the rigid/flexible substrates 107A, 205 and 207 (see FIGS. 1A, 1B and 2) may be implemented by the rigid/flexible substrate 600. In some embodiments, the rigid/flexible substrates 107B (see FIGS. 1A and 1C) may be implemented by the rigid/flexible substrate 600 after removing the second rigid layer 611.

Figure 7:

FIG. 7 illustrates a cross-sectional view of a rigid/flexible substrate 700 in accordance with some embodiments. In some embodiments, the rigid/flexible substrate 700 comprises a first rigid portion 701, a second rigid portion 703 and a flexible portion 705 interposed between and connecting the first rigid portion 701 to the second rigid portion 703. In some embodiments, the rigid/flexible substrate 700 comprises a printed circuit board (PCB). In some embodiments, the rigid/flexible substrate 700 comprises a first rigid layer 707, a second rigid layer 711, and a flexible layer 709 interposed between the first rigid layer 707 and the second rigid layer 711. In some embodiments, the first rigid layer 707 may be formed using similar materials and methods as the first rigid layer 307 described above with reference to FIG. 3 and the description is not repeated herein. In some embodiments, the second rigid layer 711 may be formed using similar materials and methods as the second rigid layer 311 described above with reference to FIG. 3 and the description is not repeated herein. In some embodiments, the flexible layer 709 may be formed using similar materials and methods as the flexible layer 309 described above with reference to FIG. 3 and the description is not repeated herein.

The first rigid layer 707 is patterned to expose a portion of a lower surface of the flexible layer 709 and the second rigid layer 711 is patterned to expose a portion of an upper surface of the flexible layer 709. The patterning process may comprise suitable photolithography and etching methods. The first rigid portion 701 comprises a remaining portion of the first rigid layer 707 and a portion of the flexible layer 609 disposed directly over the remaining portion of the first rigid layer 707. The second rigid portion 703 comprises a remaining portion of the second rigid layer 711 and a portion of the flexible layer 609 disposed directly below the remaining portion of the first rigid layer second rigid layer 711. A portion of the flexible layer 709 interposed between the first rigid portion 701 and the second rigid portion 703 forms a flexible portion 705 of the rigid/flexible substrate 700. In some embodiments, the rigid/flexible substrates 107A, 205 and 207 (see FIGS. 1A, 1B and 2) may be implemented by the rigid/flexible substrate 700. In some embodiments, the rigid/flexible substrates 107B (see FIGS. 1A and 1C) may be implemented by the rigid/flexible substrate 700 after removing the first rigid layer 707.

Figure 8:
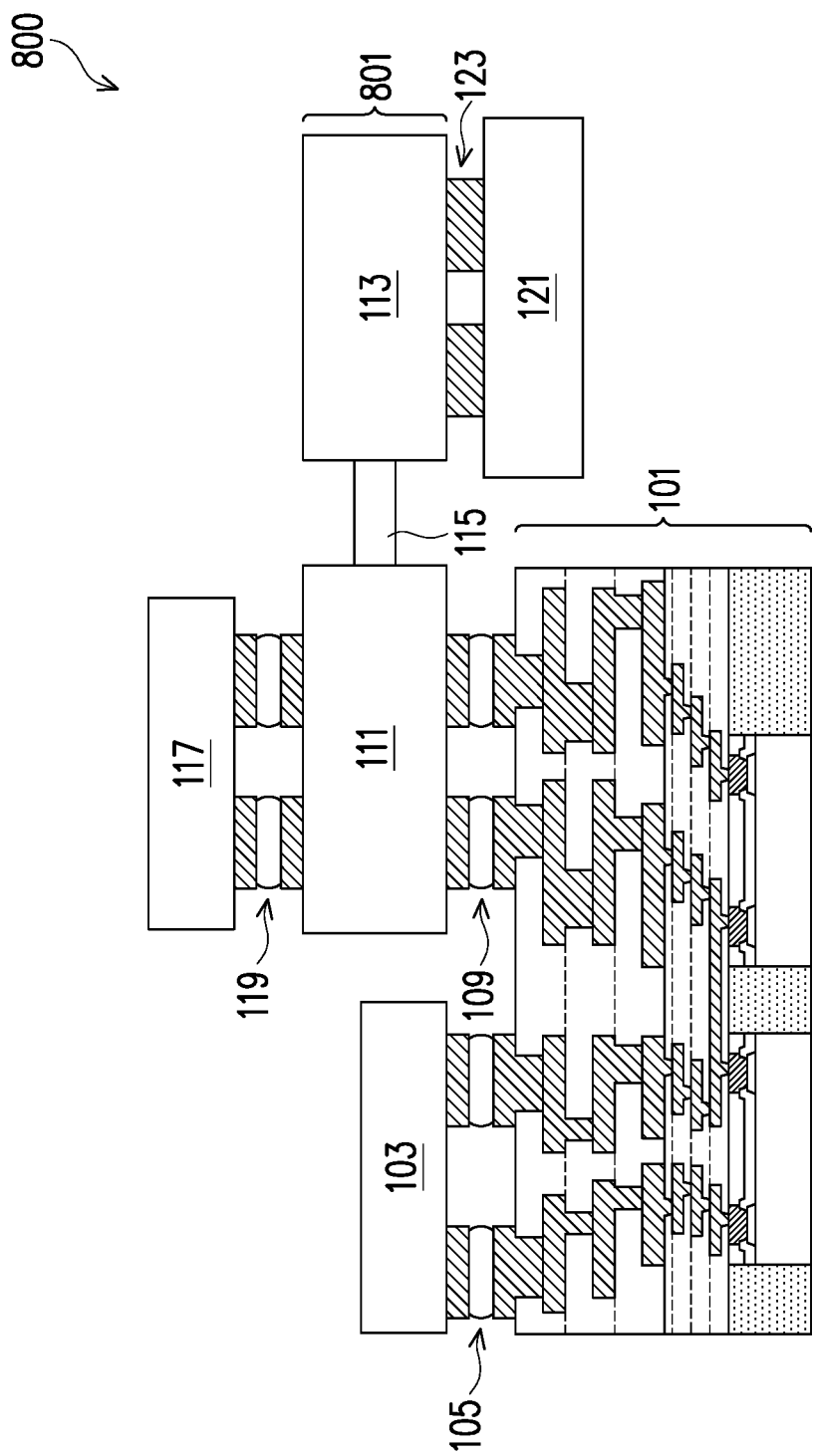
FIG. 8 illustrates a cross-sectional view of a package in accordance with some embodiments.

FIG. 8 illustrates a cross-sectional view of a package 800 in accordance with some embodiments. In some embodiments, the package 800 may be similar to the package 100A described above with reference to FIGS. 1A and 1B, with like features being labeled by like numerical references, and the description of like features is not repeated herein. In such embodiments, the rigid/flexible substrates 801 may be implemented by the rigid/flexible substrates 107A illustrated in FIGS. 1A and 1B. The rigid/flexible substrates 801 may also be implemented by the rigid/flexible substrates 300, 400, 500, 600, or 700 illustrated in FIGS. 3-7, respectively. In distinction with the package 100A, the package 800 comprises connector modules 121 that are bonded to lower surfaces of second rigid portions 113 of the rigid/flexible substrates 801. In alternative embodiments, the package 800 may be similar to the package 100B described above with reference to FIGS. 1A and 1C, with like features being labeled by like numerical references, and the description of like features is not repeated herein. In such embodiments, the rigid/flexible substrates 801 may be implemented by the rigid/flexible substrates 107B illustrated in FIGS. 1A and 1C.

Figure 9:
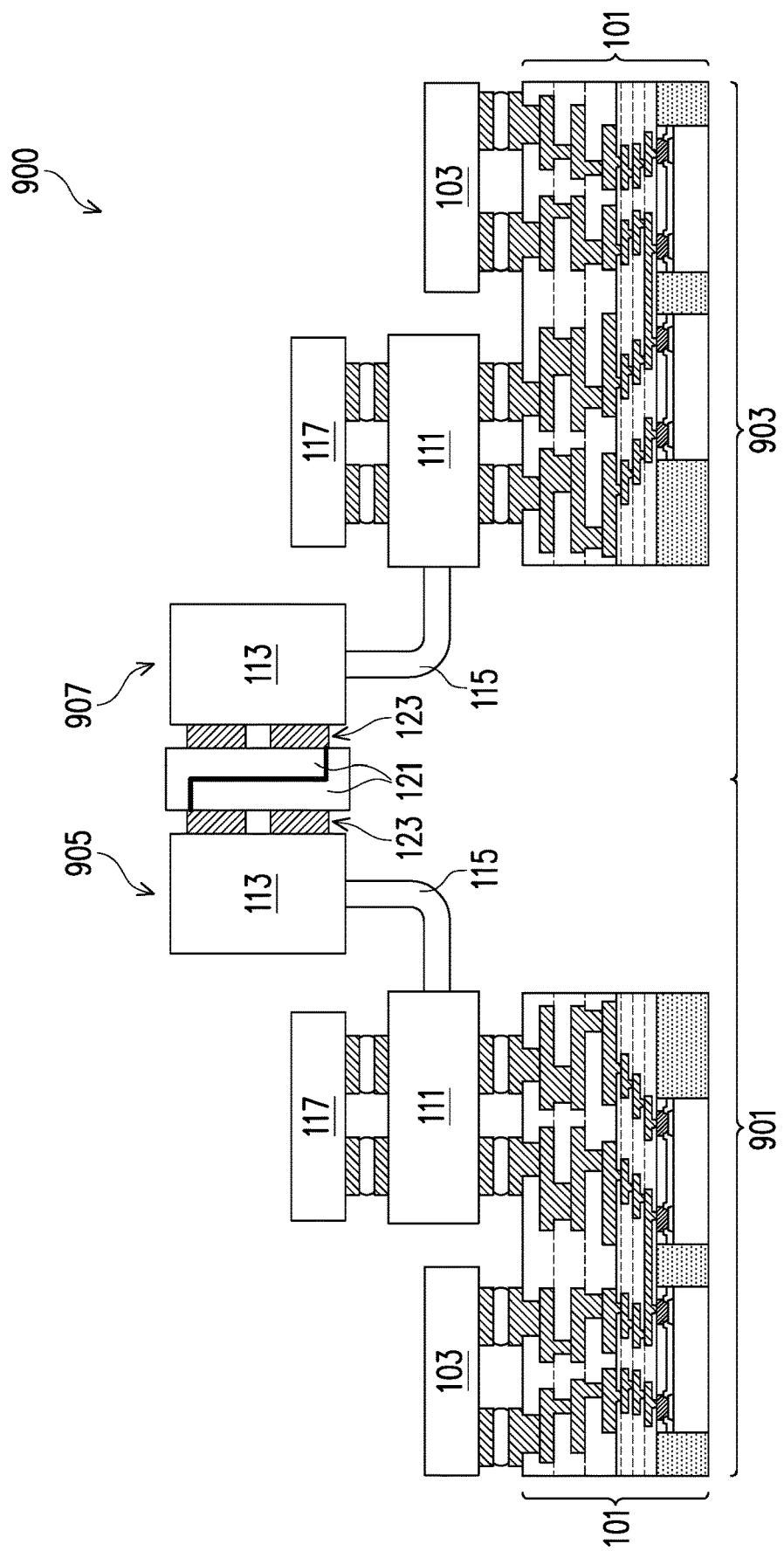
FIG. 9 illustrates a cross-sectional view of a package device in accordance with some embodiments.

FIG. 9 illustrates a cross-sectional view of a package device 900 in accordance with some embodiments. In some embodiments, the package device 900 comprises a plurality of packages coupled to one another using respective connector modules. FIG. 9 illustrates two adjacent packages 901 and 903 of the package device 900. In some embodiments, the packages 901 and 903 are similar to the package 800 described above with reference to FIG. 8, with like features being labeled by like numerical references, and the description of like features is not repeated herein. In some embodiments, a flexible portion 115 of a rigid/flexible substrate 905 of the package 901 and a flexible portion 115 of a rigid/flexible substrate 907 of the package 903 are bent upward, such that a connector module 121 of the package 901 is attached to a connector module 121 of the package 903 and provides electrical connection between the package 901 and the package 903. In some embodiments, the connector module 121 of the package 901 and the connector module 121 of the package 903 are disposed above a topmost surface of a package component 101 of the package 901 and a topmost surface of a package component 101 of the package 903. The rigid/flexible substrate 905 may be implemented by the rigid/flexible substrates 107A, 107B, 300, 400, 500, 600, or 700 illustrated in FIGS. 1B, 1C, 3-7, respectively. The rigid/flexible substrate 907 may be implemented by the rigid/flexible substrates 107A, 107B, 300, 400, 500, 600, or 700 illustrated in FIGS. 1B, 1C, 3-7, respectively.

Figure 10:
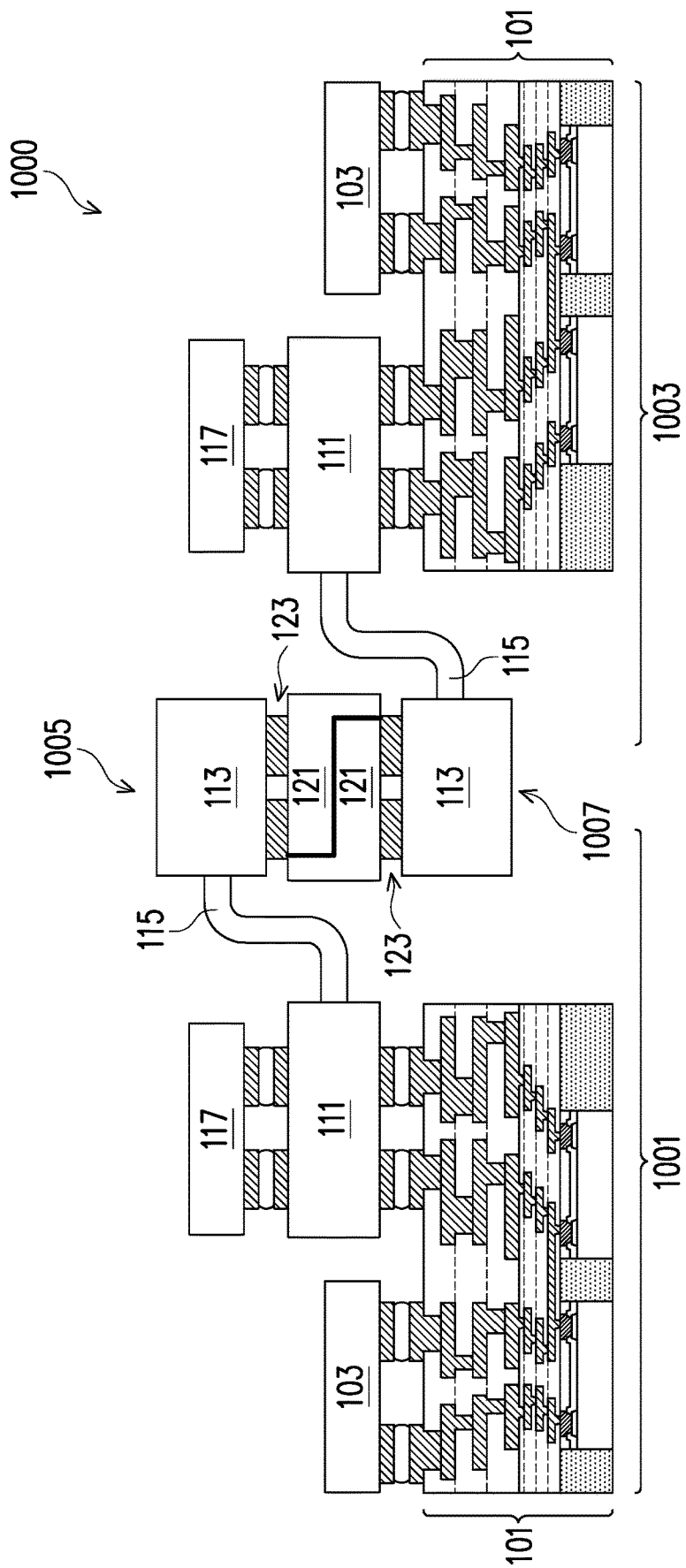
FIG. 10 illustrates a cross-sectional view of a package device in accordance with some embodiments.

FIG. 10 illustrates a cross-sectional view of a package device 1000 in accordance with some embodiments. In some embodiments, the package device 1000 comprises a plurality of packages coupled to one another using respective connector modules. FIG. 10 illustrates two adjacent packages 1001 and 1003 of the package device 1000. In some embodiments, the package 1001 is similar to the package 800 described above with reference to FIG. 8, with like features being labeled by like numerical references, and the description of like features is not repeated herein. In some embodiments, the package 1003 is similar to the package 100A described above with reference to FIGS. 1A and 1B, with like features being labeled by like numerical references, and the description of like features is not repeated herein. In alternative embodiments, the package 1003 may be similar to the package 100B described above with reference to FIGS. 1A and 1C. In some embodiments, a flexible portion 115 of a rigid/flexible substrate 1005 of the package 1001 is bent upwards and a flexible portion 115 of a rigid/flexible substrate 1007 of the package 1003 is bent downwards, such that a connector module 121 of the package 1001 is attached to a connector module 121 of the package 1003 and provides electrical connection between the package 1001 and the package 1003. In some embodiments, the connector module 121 of the package 1001 and the connector module 121 of the package 1003 are interposed between a first rigid portion 111 of the rigid/flexible substrate 1005 and a first rigid portion 111 of the rigid/flexible substrate 1007. The rigid/flexible substrate 1005 may be implemented by the rigid/flexible substrates 107A, 107B, 300, 400, 500, 600, or 700 illustrated in FIGS. 1B, 1C, 3-7, respectively. The rigid/flexible substrate 1007 may be implemented by the rigid/ flexible substrates 107A, 107B, 300, 400, 500, 600, or 700 illustrated in FIGS. 1B, 1C, 3-7, respectively.

Figure 11A:
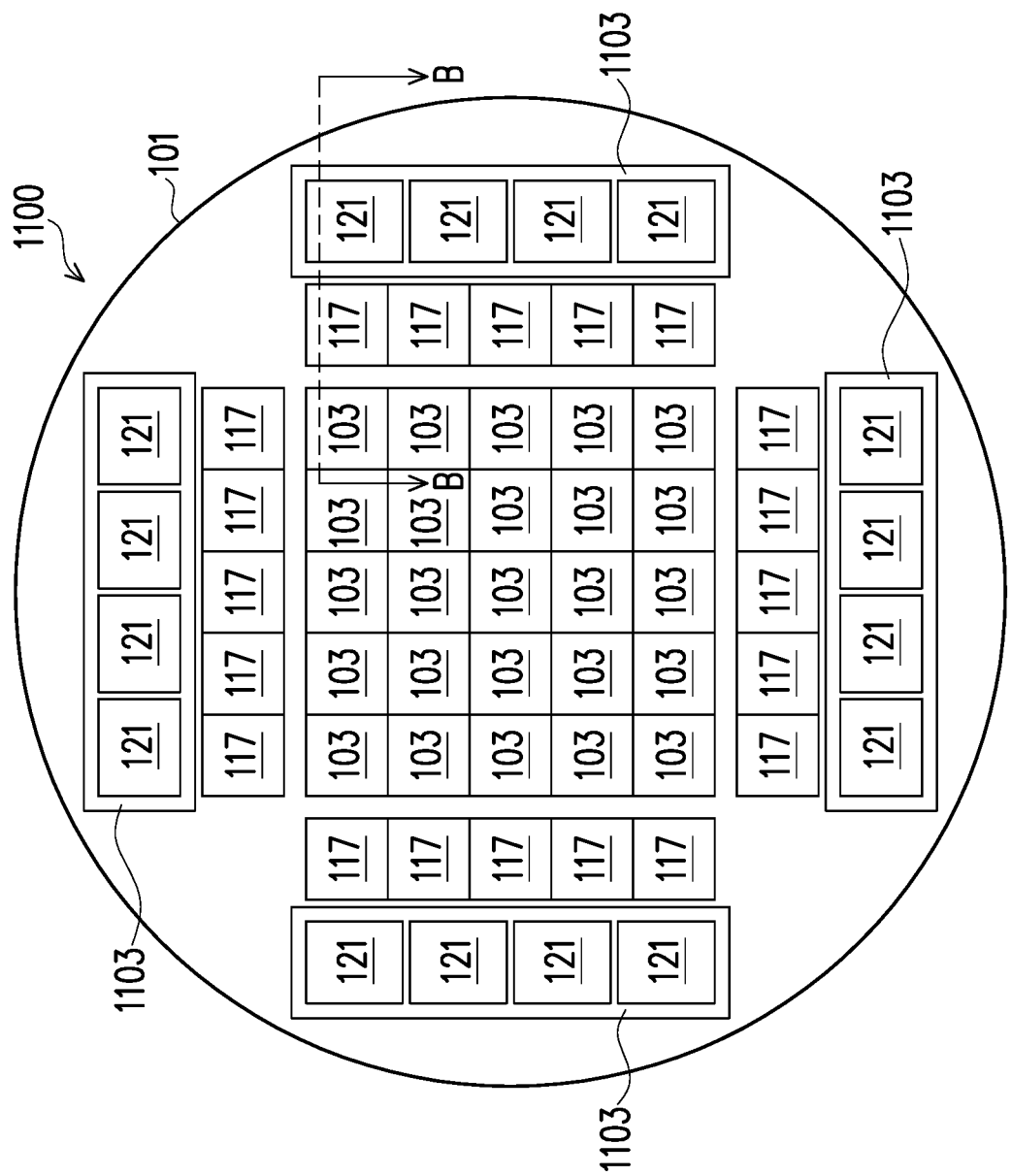
FIGS. 11A and 11B illustrate top and cross-sectional views of a package in accordance with some embodiments.
Figure 11B:
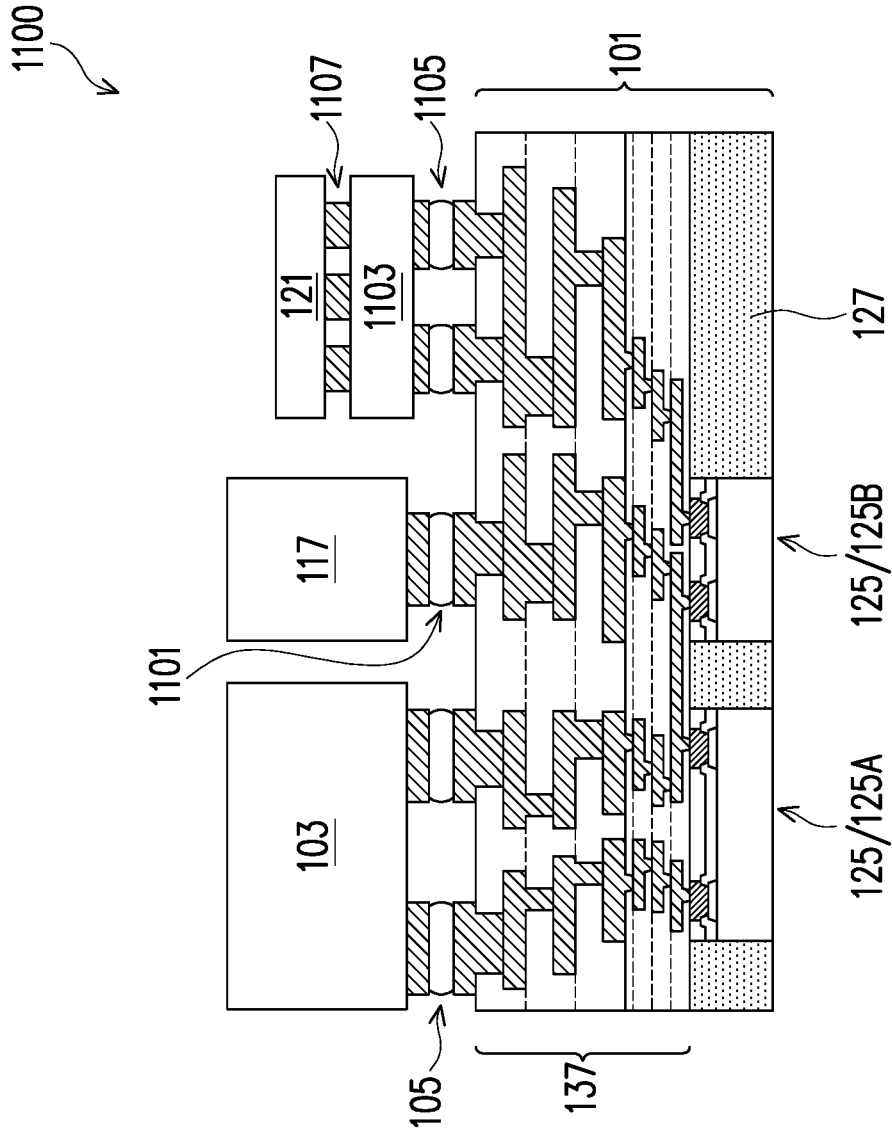

FIGS. 11A and 11B illustrate top and cross-sectional views of a package 1100 in accordance with some embodiments. FIG. 11A illustrates a top view of the package 1100, while FIG. 11B illustrates a cross-sectional view of the package 1100 along a line BB illustrated in FIG. 11A. In some embodiments, the package 1100 is similar to the package 100 described above with reference to FIGS. 1A and 1B, with like features being labeled by like numerical references, and the description of like features is not repeated herein. In some embodiments, an area of a redistribution structure 137 of the package 1100 is sufficiently large enough that sockets 103 and 117 and connector modules 121 attached to redistribution structure 137 are disposed within a perimeter of the redistribution structure 137 (coinciding with a perimeter of the package component 101). In such embodiments, rigid/flex substrates are not used to attach the sockets 117 and connector modules 121 to redistribution structure 137. In some embodiments, the sockets 117 are attached to the redistribution structure 137 using connector joints 1101. In some embodiments, the connector joints 1101 may be formed using similar materials and methods as the connector joints 105 described above with reference to FIG. 1B and the description is not repeated herein. In some embodiments, interposer substrates 1103 are attached to the redistribution structure 137 using connector joints 1105 and the connector modules 121 are attached to each of the interposer substrates 1103 using connector joints 1107. The interposer substrates 1103 may be formed using similar materials and methods as the IC dies 125 described above with reference to FIGS. 1A and 1B and the description is not repeated herein. In some embodiments, the interposer substrates 1103 may not include active device therein. In some embodiments, the connector joints 1105 and 1107 may be formed using similar materials and methods as the connector joints 105 described above with reference to FIG. 1B and the description is not repeated herein.

Figure 12:
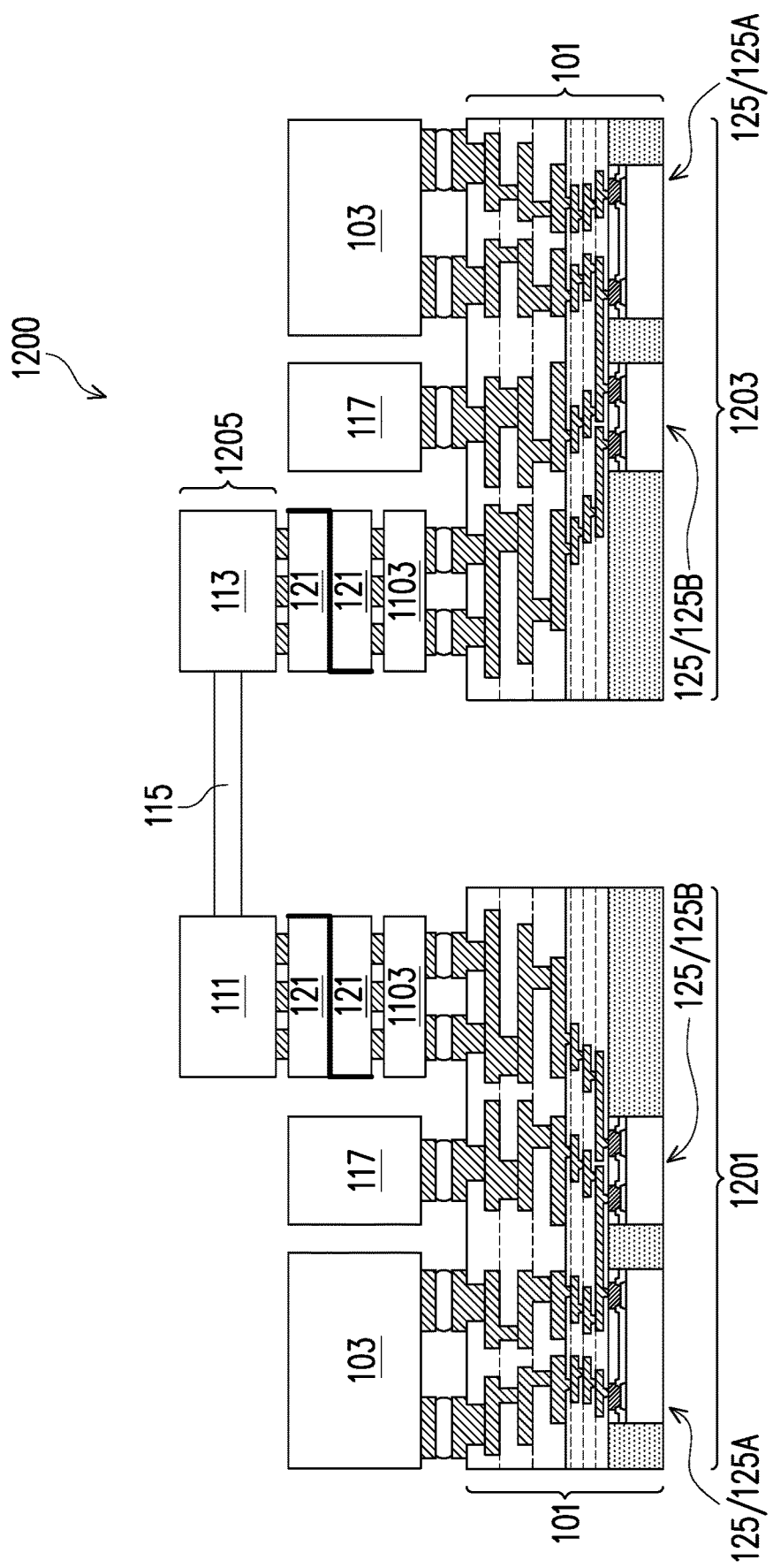
FIG. 12 illustrates a cross-sectional view of a package device in accordance with some embodiments.

FIG. 12 illustrates a cross-sectional view of a package device 1200 in accordance with some embodiments. In some embodiments, the package device 1200 comprises a plurality of packages coupled to one another using respective connector modules. FIG. 12 illustrates two adjacent packages 1201 and 1203 of the package device 1200. In some embodiments, the packages 1201 and 1203 is similar to the package 1100 described above with reference to FIGS. 11A and 11B, with like features being labeled by like numerical references, and the description of like features is not repeated herein. In some embodiments, a rigid/flexible substrate 1205 electrically connects the package 1201 to the package 1203. A plurality connector modules 121 are bonded to a lower surface of a first rigid portion 111 of the rigid/flexible substrate 1205 and a lower surface of a second rigid portion 113 of the rigid/flexible substrate 1205. The connector modules 121 bonded to the lower surface of the first rigid portion 111 of the rigid/flexible substrate 1205 are attached to respective connector modules 121 of the package 1201. The connector modules 121 bonded to the lower surface of the second rigid portion 113 of the rigid/flexible substrate 1205 are attached to respective connector modules 121 of the package 1203. The rigid/flexible substrate 1205 may be implemented by the rigid/flexible substrates 107A, 107B, 300, 400, 500, 600, or 700 illustrated in FIGS. 1B, 1C, 3-7, respectively.

Figure 13:
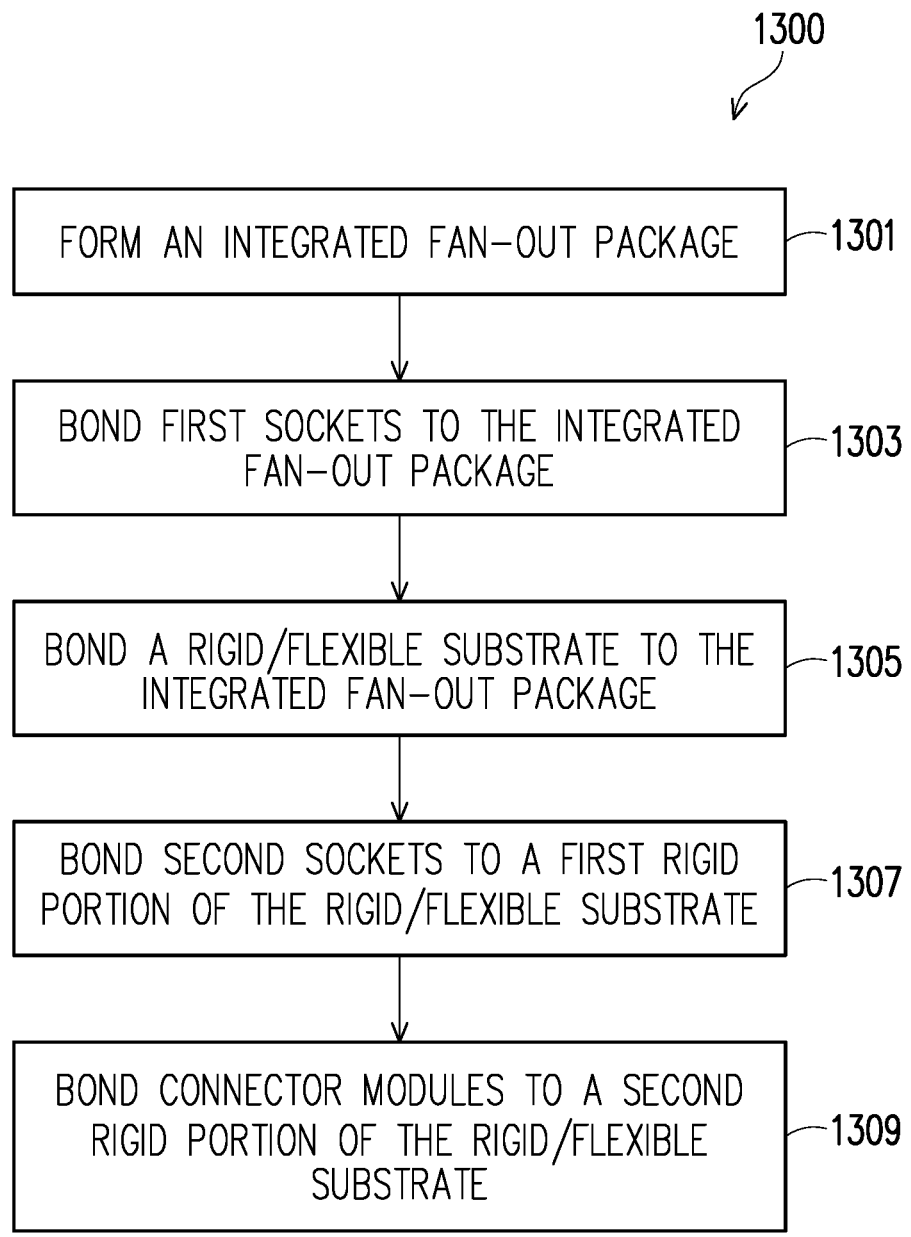
FIG. 13 is a flow diagram illustrating a method of forming a package in accordance with some embodiments.

FIG. 13 is a flow diagram illustrating a method 1300 of forming a package in accordance with some embodiments. The method 1300 starts with step 1301, where an integrated fan-out package (such as the package component 101 illustrated in FIGS. 1A and 1B) is formed as described above with reference to FIGS. 1A and 1B. In step 1303, first sockets (such as the sockets 103 illustrated in FIGS. 1A and 1B) are bonded to the integrated fan-out package as described above with reference to FIGS. 1A and 1B. In step 1305, a rigid/flexible substrate (such as the rigid/flexible substrate 107A illustrated in FIGS. 1A and 1B) is bonded to the integrated fan-out package as described above with reference to FIGS. 1A and 1B. In step 1307, second sockets (such as the sockets 117 illustrated in FIGS. 1A and 1B) are bonded to a first rigid portion of the rigid/flexible substrate as described above with reference to FIGS. 1A and 1B. In step 1309, connector modules (such as the connector modules 121 illustrated in FIGS. 1A and 1B) are bonded to a second rigid portion of the rigid/flexible substrate as described above with reference to FIGS. 1A and 1B.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an embodiment, a device includes a package. The package includes a plurality of dies, an encapsulant encapsulating the plurality of dies, and a redistribution structure over the plurality of dies and the encapsulant. The device further includes first sockets bonded to a top surface of the redistribution structure and a rigid/flexible substrate bonded to the top surface of the redistribution structure. The rigid/flexible substrate includes a first rigid portion, a second rigid portion, and a flexible portion interposed between the first rigid portion and the second rigid portion. The device further includes second sockets bonded to the first rigid portion of the rigid/flexible substrate and connector modules bonded to the second rigid portion of the rigid/flexible substrate.

In another embodiment, a device includes an integrated fan-out package, first sockets bonded to an interior portion of a top surface of the integrated fan-out package, and a rigid/flexible substrate bonded to a peripheral portion of the top surface of the integrated fan-out package. The rigid/flexible substrate includes a first rigid portion, a second rigid portion, and a flexible portion connecting the first rigid portion to the second rigid portion. The device further includes second sockets bonded to a top surface of the first rigid portion of the rigid/flexible substrate and connector modules bonded to the second rigid portion of the rigid/flexible substrate.

In yet another embodiment, a device includes a first package and a first rigid/flexible substrate. The first rigid/flexible substrate includes a first rigid portion, a second rigid portion, and a flexible portion interposed between the first rigid portion and the second rigid portion. The first rigid portion of the first rigid/flexible substrate is bonded to a top surface of the first package. The device further includes first connector modules bonded to the second rigid portion of the first rigid/flexible substrate, a second package, and a second rigid/flexible substrate. The second rigid/flexible substrate includes a first rigid portion, a second rigid portion, and a flexible portion interposed between the first rigid portion and the second rigid portion. The first rigid portion of the second rigid/flexible substrate is bonded to a top surface of the second package. The device further includes second connector modules bonded to the second rigid portion of the second rigid/flexible substrate. The second connector modules are connected to the first connector modules.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a package, the package comprising:
        a plurality of dies;
        an encapsulant encapsulating the plurality of dies; and
        a redistribution structure over the plurality of dies and the encapsulant;
    first sockets bonded to a top surface of the redistribution structure;
    a rigid/flexible substrate bonded to the top surface of the redistribution structure, the rigid/flexible substrate comprising:
        a first rigid portion;
        a second rigid portion; and
        a flexible portion interposed between the first rigid portion and the second rigid portion;
    second sockets bonded to the first rigid portion of the rigid/flexible substrate; and
    connector modules bonded to the second rigid portion of the rigid/flexible substrate.

2. The device of claim 1, wherein the first rigid portion of the rigid/flexible substrate comprises a first rigid layer and a first portion of a flexible layer.

3. The device of claim 2, wherein the second rigid portion of the rigid/flexible substrate comprises a second rigid layer and a second portion of the flexible layer.

4. The device of claim 3, wherein the flexible portion of the rigid/flexible substrate comprises a third portion of the flexible layer, and wherein the third portion of the flexible layer is interposed between the first portion of the flexible layer and the second portion of the flexible layer.

5. The device of claim 3, wherein the first rigid layer and the second rigid layer are disposed on a same side of the flexible layer.

6. The device of claim 3, wherein the first rigid layer and the second rigid layer are disposed on opposite sides of the flexible layer.

7. The device of claim 1, wherein a thickness of the first rigid portion of the rigid/flexible substrate is different from a thickness of the flexible portion of the rigid/flexible substrate.

8. A device comprising:
    an integrated fan-out package;
    first sockets bonded to an interior portion of a top surface of the integrated fan-out package;
    a rigid/flexible substrate bonded to a peripheral portion of the top surface of the integrated fan-out package, the rigid/flexible substrate comprising:
        a first rigid portion;
        a second rigid portion; and
        a flexible portion connecting the first rigid portion to the second rigid portion;
    second sockets bonded to a top surface of the first rigid portion of the rigid/flexible substrate; and
    connector modules bonded to the second rigid portion of the rigid/flexible substrate.

9. The device of claim 8, wherein the connector modules are bonded to a top surface the second rigid portion of the rigid/flexible substrate.

10. The device of claim 8, wherein the connector modules are bonded to a bottom surface the second rigid portion of the rigid/flexible substrate.

11. The device of claim 8, wherein the second rigid portion of the rigid/flexible substrate extends beyond a perimeter of the integrated fan-out package in a plan view.

12. The device of claim 11, wherein at least a portion of the flexible portion of the rigid/flexible substrate extends beyond the perimeter of the integrated fan-out package in the plan view.

13. The device of claim 11, wherein the first sockets are disposed inside the perimeter of the integrated fan-out package in the plan view.

14. The device of claim 11, wherein the second sockets are disposed outside of the perimeter of the integrated fan-out package in the plan view.

15. A device comprising:
    a first package;
    a first rigid/flexible substrate, the first rigid/flexible substrate comprising:
        a first rigid portion;
        a second rigid portion; and
        a flexible portion interposed between the first rigid portion and the second rigid portion, wherein the first rigid portion of the first rigid/flexible substrate is bonded to a top surface of the first package;
    first connector modules bonded to the second rigid portion of the first rigid/flexible substrate;
    a second package;
    a second rigid/flexible substrate, the second rigid/flexible substrate comprising:
        a first rigid portion;
        a second rigid portion; and
        a flexible portion interposed between the first rigid portion and the second rigid portion, wherein the first rigid portion of the second rigid/flexible substrate is bonded to a top surface of the second package; and
    second connector modules bonded to the second rigid portion of the second rigid/flexible substrate, wherein the second connector modules are connected to the first connector modules.

16. The device of claim 15, further comprising first sockets bonded to the top surface of the first package.

17. The device of claim 16, further comprising second sockets bonded to the first rigid portion of the first rigid/flexible substrate.

18. The device of claim 15, further comprising third sockets bonded to the top surface of the second package.

19. The device of claim 18, further comprising fourth sockets bonded to the first rigid portion of the second rigid/flexible substrate.

20. The device of claim 15, wherein the second rigid portion of the first rigid/flexible substrate and the second rigid portion of the second rigid/flexible substrate are interposed between the first package and the second package.

* * * * *